(12) United States Patent
Lo et al.

(10) Patent No.: US 9,984,273 B2
(45) Date of Patent: May 29, 2018

(54) SENSING ELEMENT AND FINGERPRINT SENSOR COMPRISING THE SAME

(71) Applicant: IMAGE MATCH DESIGN INC., Hsinchu (TW)

(72) Inventors: Yen-Kuo Lo, Tainan (TW); Chia-Hua Yeh, Hsinchu (TW)

(73) Assignee: IMAGE MATCH DESIGN INC., Hsinchu County (TW)

( * ) Notice: Subject to any disclaimer, the term of this patent is extended or adjusted under 35 U.S.C. 154(b) by 210 days.

(21) Appl. No.: 14/984,705

(22) Filed: Dec. 30, 2015

(65) Prior Publication Data

US 2017/0193262 A1    Jul. 6, 2017

(51) Int. Cl.
*G06K 9/00*    (2006.01)
*G01R 27/26*    (2006.01)

(52) U.S. Cl.
CPC ....... *G06K 9/0002* (2013.01); *G01R 27/2605* (2013.01)

(58) Field of Classification Search
USPC .................................................. 382/124–127
See application file for complete search history.

(56) References Cited

U.S. PATENT DOCUMENTS 7,504,833 B1 * 3/2009 Seguine ............... G06K 9/0002
324/663
7,864,992 B2    1/2011 Riedijk et al.

2005/0078856 A1 * 4/2005 Miyasaka ........... G06K 9/0002
382/124
2005/0089200 A1 * 4/2005 Nysaether ........... G06K 9/0002
382/124
2010/0156847 A1 * 6/2010 No ..................... G02F 1/13338
345/175

FOREIGN PATENT DOCUMENTS

TW    M508714    9/2015
TW    M512478    11/2015

OTHER PUBLICATIONS

Office Action dated May 24, 2017 for the Taiwan counterpart application 105132251.
English abstract translation of the office Action dated May 24, 2017 for the Taiwan counterpart application 105132251.
English abstract translation of TW M508714.
English abstract translation of TW M512478.

* cited by examiner

*Primary Examiner* — Alex Liew
(74) *Attorney, Agent, or Firm* — WPAT, P.C., Intellectual Property Attorneys; Anthony King

(57) ABSTRACT

A fingerprint sensor includes a substrate, a sensing electrode over the substrate, a first electrode and a second electrode. The sensing electrode is configured to detect a capacitance in response to a touch event on the fingerprint sensor. The first electrode is disposed between the substrate and the sensing electrode, while the second electrode is disposed between the first electrode and the sensing electrode. The first electrode and the second electrode are configured to define a capacitance therebetween. The sensitivity of the fingerprint sensor is inversely proportional to the capacitance between the first electrode and the second electrode.

18 Claims, 10 Drawing Sheets

… … …

SENSING ELEMENT AND FINGERPRINT SENSOR COMPRISING THE SAME

TECHNICAL FIELD

The present disclosure is generally related to a sensing element and, more particularly, to a fingerprint sensor comprising the sensing elements.

BACKGROUND

Touch devices or touchscreens have been commonly used in electronic devices such as smart phones, personal computers and game consoles. Some touch devices not only provide a user friendly interface and bring users convenience, but also work in conjunction with a fingerprint sensor for the purpose of data security. For example, the fingerprint sensor can determine whether a user is authorized to use the electronic device by verifying the user's identity in the form of fingerprint. Therefore, touch sensitivity has been the subject of interest in developing advanced touch devices.

SUMMARY

Embodiments of the present invention provide a fingerprint sensor that includes a substrate, a sensing electrode over the substrate, configured to detect a capacitance in response to a touch event on the fingerprint sensor, a first electrode between the substrate and the sensing electrode, and a second electrode between the first electrode and the sensing electrode. The first electrode and the second electrode are configured to define a capacitance therebetween. The sensitivity of the fingerprint sensor is inversely proportional to the capacitance between the first electrode and the second electrode.

In an embodiment, the fingerprint sensor further comprises an amplifier, which includes an inverting terminal coupled to the sensing electrode, and an output coupled to the first electrode.

Moreover, the fingerprint sensor further comprises a switch between the inverting terminal and the output of the amplifier.

The amplifier includes a non-inverting terminal configured to selectively receive one of a first reference voltage and a second reference voltage. The sensitivity of the fingerprint sensor is proportional to the difference between the first reference voltage and the second reference voltage.

Furthermore, the sensitivity ($\Delta$Vout) of the fingerprint sensor is given by the following equation:

$$\Delta Vout = (Vref2 - Vref1)\left(\frac{CF}{CS}\right)$$

where Vref2 and Vref1 represent the second reference voltage and the first reference voltage, respectively, CF represents the capacitance in response to the touch event, and CS represents the capacitance between the first electrode and the second electrode.

In an embodiment, the fingerprint sensor further comprises a first switch configured to conduct the first reference voltage to the non-inverting terminal of the amplifier, and a second switch configured to conduct the second reference voltage to the non-inverting terminal of the amplifier.

In another embodiment, the fingerprint sensor further comprises a switch configured to conduct a reference voltage to the second electrode.

In yet another embodiment, the fingerprint sensor further comprises a switch between the sensing electrode and the second electrode.

In still another embodiment, the fingerprint sensor further comprises a low-k insulating layer between the first electrode and the second electrode.

Embodiments of the present invention also provide a fingerprint to sensor that comprises a substrate, a sensing electrode over the substrate, configured to detect a capacitance in response to a touch event on the fingerprint sensor, a first electrode between the substrate and the sensing electrode, a second electrode between the first electrode and the sensing electrode, and an amplifier including an output connected to the first electrode, a first terminal connected to the sensing electrode, and a second terminal configured to selectively receive one of a first reference voltage and a second reference voltage. The sensitivity of the fingerprint sensor is proportional to the difference between the first reference voltage and the second reference voltage.

In an embodiment, the first electrode and the second electrode are configured to define a capacitance therebetween, and the sensitivity of the fingerprint sensor is inversely proportional to the capacitance between the first electrode and the second electrode.

Moreover, the sensitivity ($\Delta$Vout) of the fingerprint sensor is given by the following equation:

$$\Delta Vout = (Vref2 - Vref1)\left(\frac{CF}{CS}\right)$$

where Vref2 and Vref1 represent the second reference voltage and the first reference voltage, respectively, CF represents the capacitance in response to the touch event, and. CS represents the capacitance between the first electrode and the second electrode.

In an embodiment, the fingerprint sensor further comprises a switch between the first terminal and the output of the amplifier.

In another embodiment, the fingerprint sensor further comprises a first switch configured to conduct the first reference voltage to the second terminal of the amplifier, and a second switch configured to conduct the second reference voltage to the second terminal of the amplifier.

In yet another embodiment, the fingerprint sensor further comprises a switch configured to conduct a reference voltage to the second electrode.

In still another embodiment, the fingerprint sensor further comprises a switch between the sensing electrode and the second electrode.

In yet still another embodiment, the fingerprint sensor further comprises a low-k insulating layer between the first electrode and the second electrode.

The fingerprint sensor according to the embodiments of the invention alleviates or eliminates the adverse effect of parasitic capacitance on the sensitivity of the fingerprint sensor. Effectively, the sensitivity is independent of undesired parasitic capacitances. Specifically, the sensitivity of the fingerprint sensor, represented by $\Delta$Vout, is proportional to (Vref2−Vref1) and inversely proportional to the capacitance CS between the first electrode and the second electrode. Since the sensitivity is inversely proportional to CS, to enhance the sensitivity of the fingerprint sensor, in an embodiment the distance between the first sensing electrode and the second sensing electrode is increased, resulting in a smaller capacitance CS. In another embodiment, the overlapped area between the first electrode and the second electrode is reduced, also resulting in a smaller CS. In still another embodiment, a low-k insulating material is disposed between the first electrode and the second electrode to help lower the dielectric constant and hence lower the capacitance CS. The dimensions of the first electrode and the second electrode, the distance therebetween, and the material of the dielectric can be determined, for example, at a layout design stage of the fingerprint sensor.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures or processes for carrying out the same purposes of the present invention without departing from the spirit and scope of the invention as set forth in the appended claims.

BRIEF DESCRIPTION OF THE DRAWINGS

Details of one or more embodiments of the disclosure are set forth in the accompanying drawings and the description below. Other features and advantages of the disclosure will be apparent from the description, drawings and claims. Throughout the various views and illustrative embodiments, like reference numerals are used to designate like elements. Reference will now be made in detail to exemplary embodiments illustrated in the accompanying drawings.

DETAIL DESCRIPTION

In order to make the disclosure comprehensible, detailed steps and structures are provided in the following description. Obviously, implementation of the disclosure does not limit special details known by persons skilled in the art. In addition, known structures and steps are not described in detail, so as not to limit the disclosure unnecessarily. Preferred embodiments of the disclosure will be described below in detail. However, in addition to the detailed description, the disclosure may also be widely implemented in other embodiments. The scope of the disclosure is not limited to the detailed description, and is defined by the claims.

Figure 1:
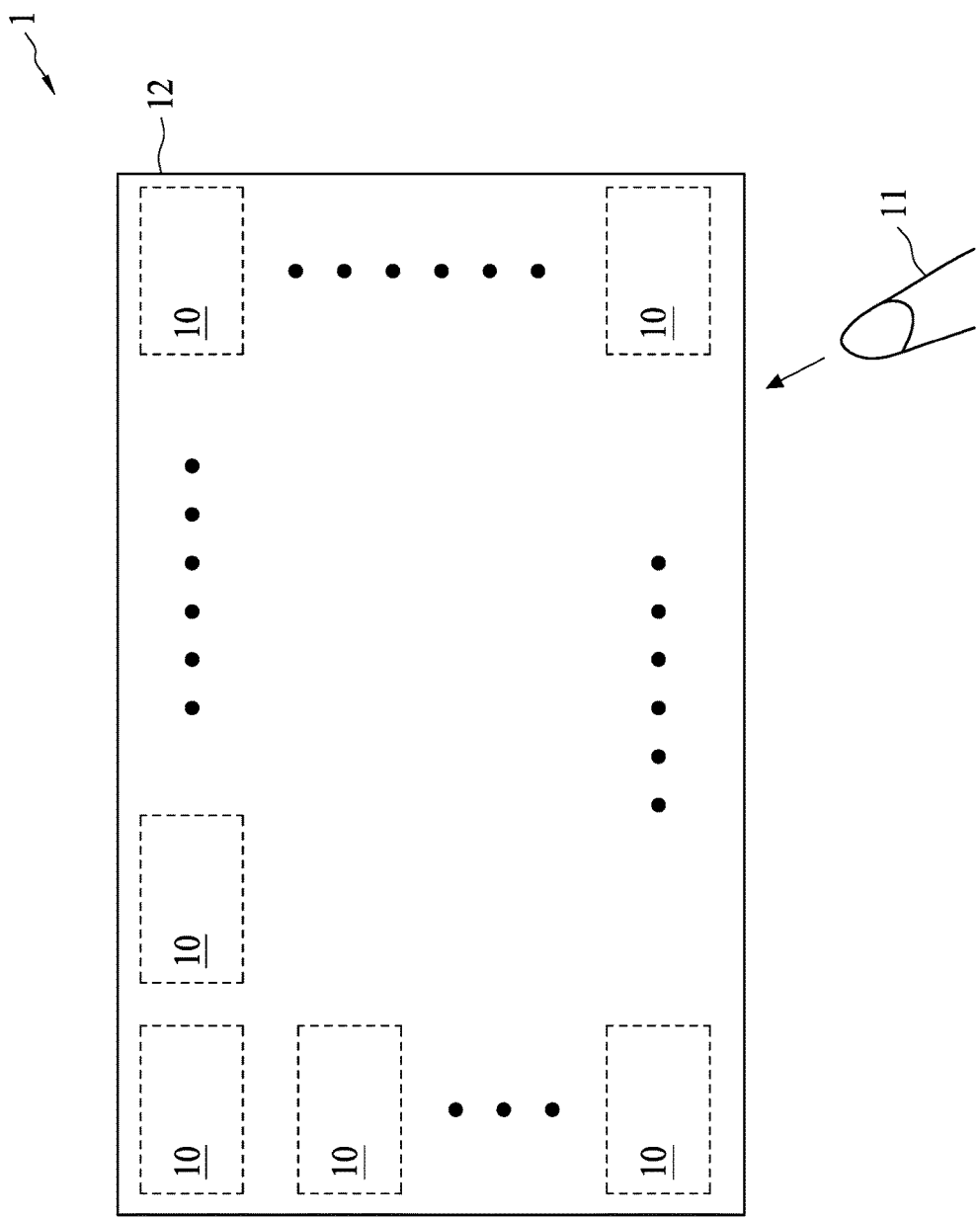
FIG. 1 is a top view of a fingerprint sensor in accordance with some embodiments of the present invention.

FIG. 1 is a top view of a fingerprint sensor 1 in accordance with some embodiments of the present invention. The fingerprint sensor 1 is adapted to work with an electronic device (not shown), such as a smart phone, a personal computer and a personal digital assistant. Referring to FIG. 1, the fingerprint sensor 1 includes an array of sensing elements 10, which are covered by a protection layer 12. The sensing elements 10 are configured to detect a touch event of an object 11, such as a stylus, pen or one or more fingers, touching the fingerprint sensor 1 via the protection layer 12.

Figure 2:
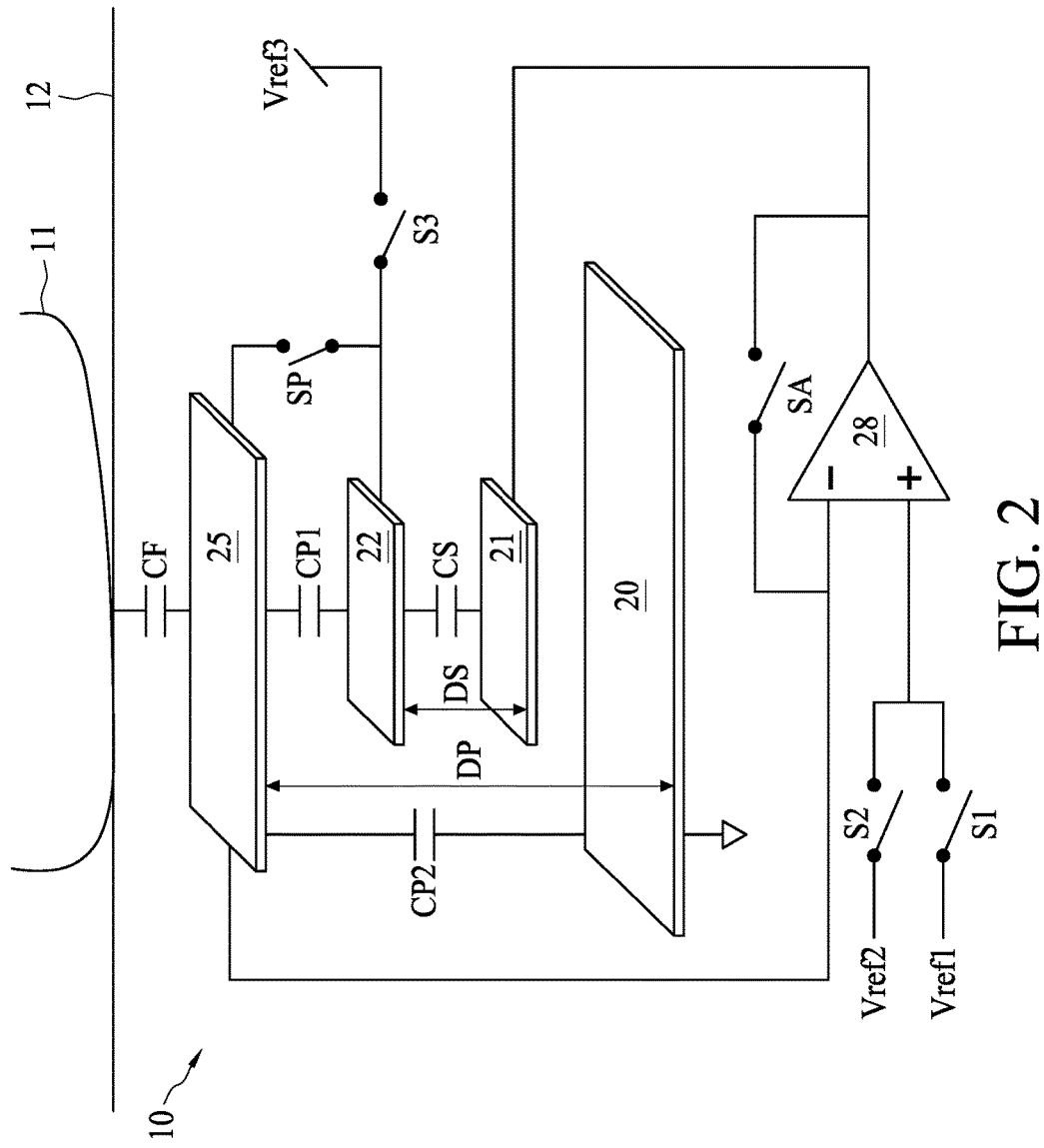
FIG. 2 is a schematic diagram of an exemplary sensing element of the fingerprint sensor shown in FIG. 1, in accordance with some embodiments of the present invention.

FIG. 2 is a schematic diagram of an exemplary sensing element 10 of the fingerprint sensor 1 shown in FIG. 1, in accordance with some embodiments of the present invention. Referring to FIG. 2, the exemplary sensing element 10 includes a sensing electrode 25, a first electrode 21, a second electrode 22, an amplifier 28 and a set of switches S1, S2, S3, SP and SA, which are all disposed over or in a substrate 20.

The sensing electrode 25, disposed near the protection layer 12, is configured to detect a capacitance CF associated with the object 11 in response to a touch event on the fingerprint sensor 1. Moreover, a capacitance CP2, which is a parasitic capacitance, exists between the sensing electrode 25 and the substrate 20. For convenience, a same reference numeral or label is used to refer to a capacitor or, when appropriate, its capacitance throughout the specification, and vice versa. For example, while the reference label "CF" as above mentioned refers to a capacitance, it may represent a capacitor having the capacitance.

The first electrode 21 and the second electrode 22 are disposed in different conductive layers over the substrate 20. In an embodiment, the first electrode 21 is disposed in a metal-1 (M1) layer over the substrate 20. Moreover, the second electrode 22, positioned between the sensing electrode 25 and the first electrode 21, is disposed in a metal-2 (M2) layer over the substrate 20. A parasitic capacitance CP1 exists between the sensing electrode 25 and the second electrode 22. Furthermore, the first electrode 21 and the second electrode 22 are configured to define therebetween a capacitance CS, as expressed in equation (1) below.

$$CS = \varepsilon \frac{mA}{DS} \tag{1}$$

where ε represents the dielectric constant of an insulating material between the first electrode 21 and the second electrode 22, "A" represents the area of the sensing electrode 25, "m" is a positive value not greater than 1, and DS represents the distance between the first electrode 21 and the second electrode 22.

In the present embodiment, the first electrode 21 and the second electrode 22 have the same areas, denoted as mA in equation (1). Since "m" is not greater than 1, the area of the first electrode 21 or the second electrode 22 is not greater than that of the sensing electrode 25. In some embodiments, however, the first electrode 21 and the second electrode 22 have different areas. In that case, the product mA is the greater area. Being disposed between the sensing electrode 25 and the substrate 20, the first electrode 21 and the second electrode 22 shield the sensing electrode 25 from the substrate, or vice versa. As a result, the effective capacitance, CP2, between the sensing electrode 25 and the substrate 20 can be expressed in equation (2) below.

$$CP2 = \varepsilon \frac{(1-m)A}{DP} \quad (2)$$

where DP represent the distance between the sensing electrode 25 and the substrate 20, and (1−m)A is the unshielded area of the sensing electrode 25, and hence an effective area that contributes to CP2.

Based on equation (1) and equation (2), the capacitance CP2 can be rewritten in equation (3) as follows.

$$CP2 = CS \frac{DS}{DP} \frac{(1-m)}{m} \quad (3)$$

In a fingerprint sensor, the value of CF depends on the geometric property of a contact surface of an object during a touch event. For example, a ridge portion of the object produces a larger capacitance than a valley portion. However, the capacitance difference may not be large enough for a fingerprint sensor to distinguish a ridge from a valley or vice versa. Moreover, parasitic capacitances may even lessen the difference and is worsen the sensing result. In the present case, parasitic capacitances CP1 and CP2 may adversely affect the sensitivity of the fingerprint sensor 1. It is desirable that the effect of CP1 and CP2 can be alleviated or even eliminated, as will be further discussed in detail.

The amplifier 28 is configured to facilitate determination of a fingerprint pattern based on the capacitance CF. In the present embodiment, the amplifier 28 includes an operational (OP) amplifier, as illustrated in FIG. 2. Moreover, the amplifier 28 is disposed in an active region or active layer of the substrate 20, even though for illustration the amplifier 28 as shown appears to be outside the substrate 20. A non-inverting terminal of the amplifier 28 selectively receives a first reference voltage Vref1 or a second reference voltage Vref2. An inverting terminal of the amplifier 28 is connected to the sensing electrode 25. Further, an output of the amplifier 28 is connected to the first sensing electrode 21.

Since the input impedance of an OP amplifier is ideally indefinite, the voltage drop across the input impedance is zero and thus both input terminals are at the same potential. In other words, the two input terminals of the amplifier 28 are virtually shorted to each other, a characteristic called "virtual short." If the non-inverting terminal of the amplifier 28 is grounded, then due to the "virtual short" between the two input terminals, the inverting terminal is also connected to ground potential, which is called "virtual ground." Further, due to relatively high capacitive load driving ability of the amplifier 28, a parasitic capacitance (not shown) between the first electrode 21 (which is connected to the output of the amplifier 28) and the substrate 20 can be neglected.

The switches S1, S2, S3, SP and SA may each include a transistor formed in the active region of the substrate 20. A controller or microprocessor (not shown) is used to control the open or closed state of each of the switches S1, S2, S3, SP and SA. Further, switch S1 is connected between the first reference voltage Vref1 and the non-inverting terminal of the amplifier 28. In an embodiment, the first reference voltage Vref1 is ground potential. In another embodiment, the first reference voltage Vref1 has a voltage level near ground potential, for example, ranging between approximately 0.3 volt (V) and 0.5V.

Switch S2 is connected between the second reference voltage Vref2 and the non-inverting terminal of the amplifier 28. In an embodiment, the second reference voltage Vref2 has a same voltage level as the operation voltage of the fingerprint sensor 1. For example, the second reference voltage Vref2 is approximately 1.8V or 3.3V. Switch S2 and switch S1 are configured to enable the non-inverting terminal of the amplifier 28 to selectively receive the first reference voltage Vref1 when switch S1 is closed and receive the second reference voltage Vref2 when switch S2 is closed.

In the present embodiment, a first switch S1 and a second switch S2 are used to conduct the first reference voltage Vref1 and the second reference voltage Vref2, respectively, to the non-inverting terminal of the amplifier 28. In some embodiments, however, a single switch may be used to selectively couple the non-inverting terminal to either the first reference voltage Vref1 or the second reference voltage Vref2. In still some embodiments, a single voltage source alternatingly providing the first reference voltage Vref1 during a first period and the second reference voltage Vref2 during a second period may be directly connected to the non-inverting terminal of the amplifier 28. In that case, the non-inverting terminal receives either the first reference voltage Vref1 or the second reference voltage Vref2 in a specific time period. As a result, the first switch S1 and the second switch S2 can be eliminated, which simplifies the circuit configuration.

Switch S3 is connected between a third reference voltage Vref3 and the second electrode 22. In an embodiment, the third reference voltage Vref3 has a same voltage level as the operation voltage of the fingerprint sensor 1. For example, the third reference voltage Vref3 is approximately 1.8V or 3.3V. As a result, the third reference voltage Vref3 and the second reference voltage Vref2 have the same voltage level. In another embodiment, the third reference voltage Vref3 has a different voltage level from the second reference voltage Vref2. Switch S3 is configured to enable the third reference voltage Vref3 to charge the capacitor CS between the first electrode 21 and the second electrode 22, and the capacitor CP1 between the second electrode 22 and the sensing electrode 25, when switch S3 is closed.

Switch SA is connected between the inverting terminal of the amplifier 28 and an output (not numbered) of the amplifier 28. Moreover, the inverting terminal of the amplifier 28 is connected to the sensing electrode 25. Switch SA is configured to connect the inverting terminal to the output of the amplifier 28 and also to the first electrode 21 when switch is closed. Moreover, by way of virtual short, switch SA enables the inverting terminal of the amplifier 28, the output of the amplifier 28 and the first electrode 21 to receive one of the first reference voltage Vref1 and the second reference voltage Vref2.

Switch SP is connected between the sensing electrode 25 and the second electrode 22. Moreover, switch SP is configured to enable the sensing electrode 25 and the second electrode 22 to be equal potential so as to facilitate charge sharing, as will be further discussed.

Figure 3A:
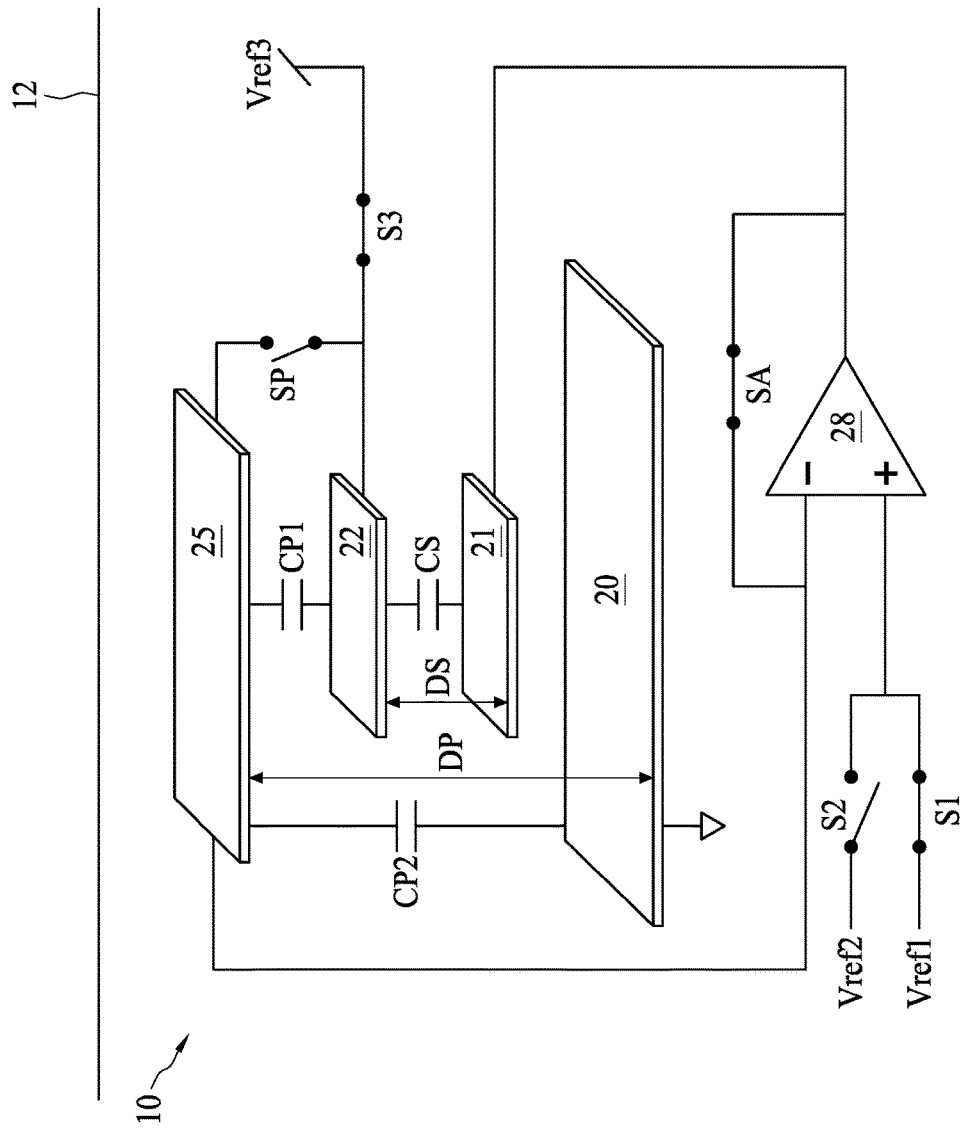
FIG. 3A is a schematic diagram of the exemplary sensing element is operating in a first phase in the absence of a touch event, in accordance with some embodiments of the present invention.

FIG. 3A is a schematic diagram of the exemplary sensing element 10 operating in a first phase in the absence of a touch event, in accordance with some embodiments of the present invention. Referring to FIG. 3A, prior to a touch event being detected, the sensing elements 10 of the fingerprint sensor 1 are reset in the first phase. In operation, switches S1, S3 and SA are closed, while switches S2 and SP are open. As a result, the non-inverting terminal of the amplifier 28 receives the first reference voltage Vref1. The inverting terminal of the amplifier 28 is connected to the output of the amplifier 28 and also to the first electrode 21. The second electrode 22 is coupled to the third reference voltage Vref3. Detailed operation will be discussed by reference to FIG. 3B.

Figure 3B:
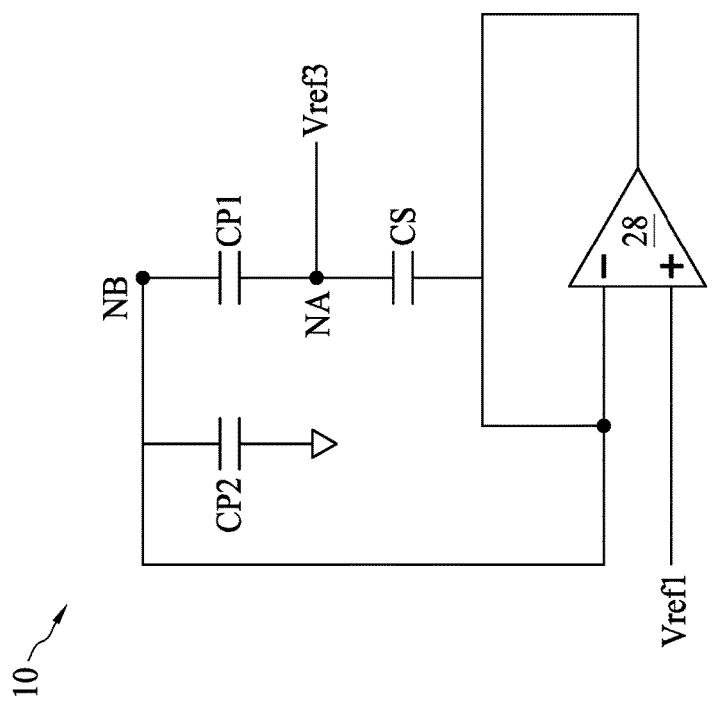
FIG. 3B is a circuit diagram of an equivalent circuit of the exemplary sensing element operating in the first phase in the absence of a touch event.

FIG. 3B is a circuit diagram of an equivalent circuit of the exemplary sensing element 10 operating in the first phase in the absence of a touch event. Referring to FIG. 3B, the voltage level at one end NA of the capacitor CS is Vref3, while at the other end (connected to the inverting terminal) of the capacitor CS, by function of virtual short as previously discussed, is Vref1. Moreover, the voltage level at one end NA of the capacitor CP1 is Vref3, while at the other end NB of the capacitor CP1 is Vref1. Furthermore, capacitor CP2 is coupled between Vref1 and ground potential. As a result, the magnitude of charge, QNA1, at the side of node NA can be expressed in equation (4) below.

$$QNA1=[(Vref3-Vref1) \times CS]+[(Vref3-Vref1) \times CP1] \quad (4)$$

In addition, the magnitude of charge, QNB1, at the side of node NB can be expressed in equation (5) below.

$$QNB1=(Vref1-Vref3) \times CP1+(Vref1 \times CP2) \quad (5)$$

Figure 4A:
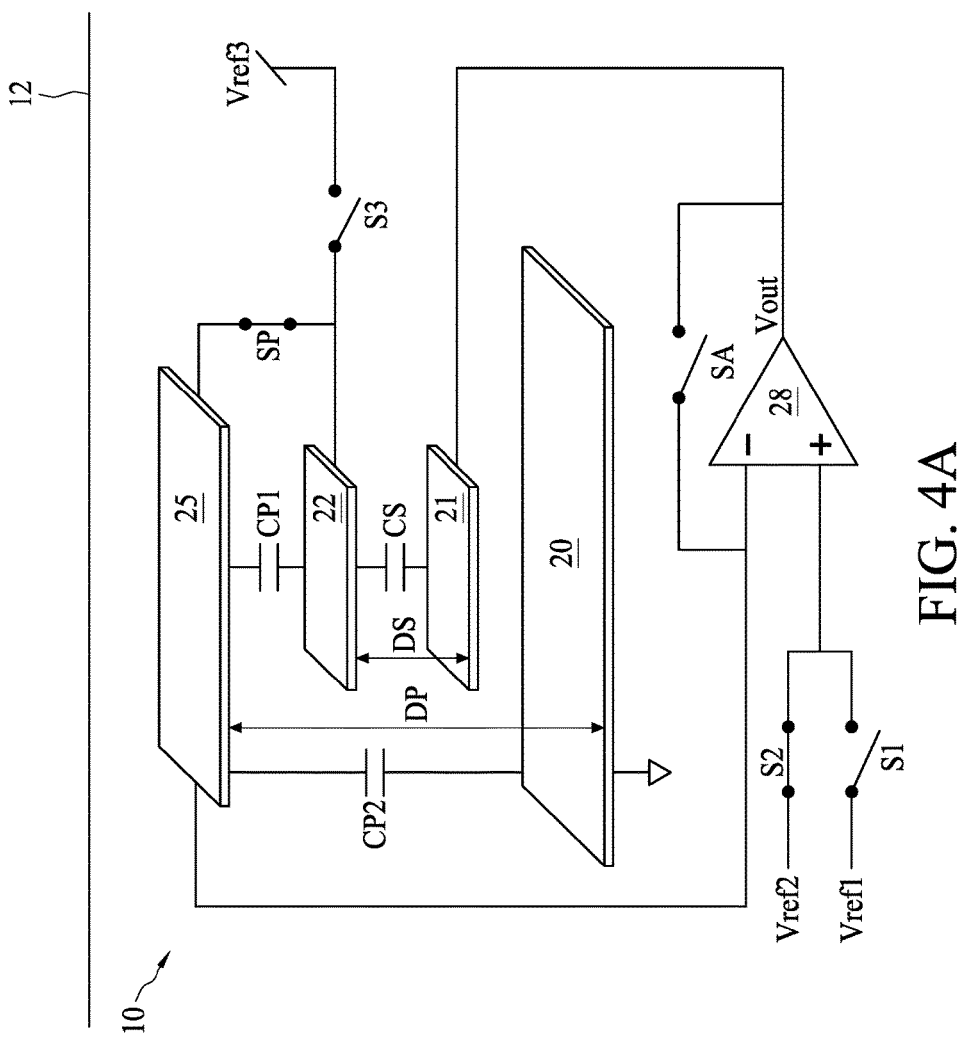
FIG. 4A is a schematic diagram of the exemplary sensing element operating in a second phase in the absence of a touch event, in accordance with some embodiments of the present invention.

FIG. 4A is a schematic diagram of the exemplary sensing element 10 operating in a second phase in the absence of a touch event, in accordance with some embodiments of the present invention. After a reset process in the first phase as discussed with reference to FIGS. 3A and 3B, a charge sharing process is conducted in the second phase. Referring to FIG. 4A, in operation, switches S2 and SP are closed, while switches S1, S3 and SA are open. As a result, the non-inverting terminal of the amplifier 28 receives the second reference voltage Vref2. The sensing electrode 25 and the second electrode 22 are connected to each other and have the same potential. Consequently, no charge can be stored in the capacitor CP1 between the sensing electrode 25 and the second electrode 22. The charge stored in the capacitor CP1 in the first phase is distributed to other capacitors in the sharing process during the second phase. Detailed operation will be discussed by reference to FIG. 4B.

Figure 4B:
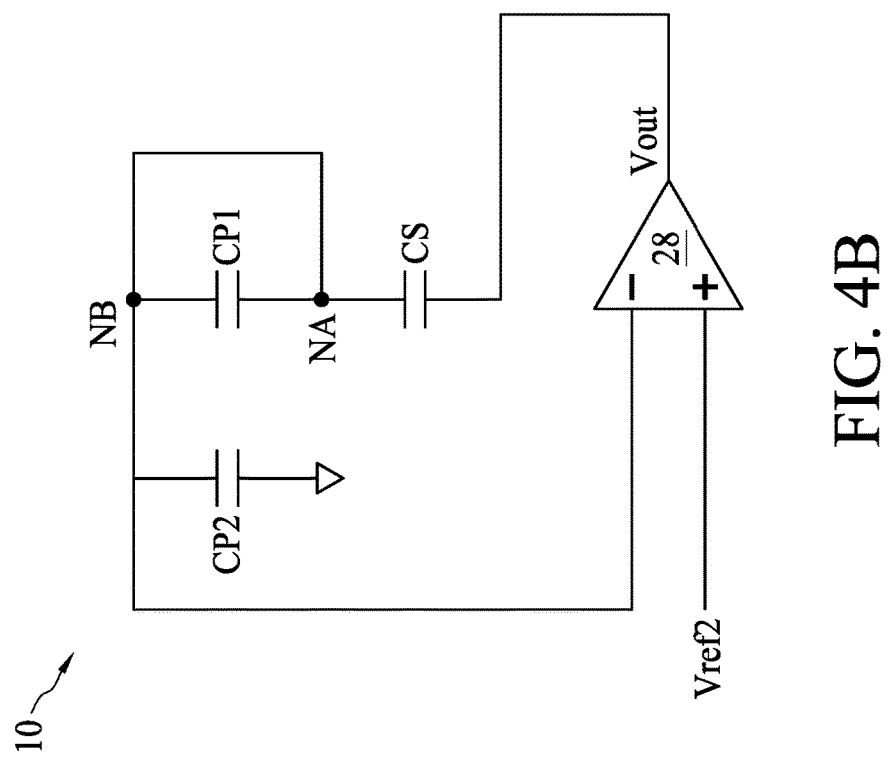
FIG. 4B is a circuit diagram of an equivalent circuit of the exemplary sensing element operating in the second phase in the absence of a touch event.

FIG. 4B is a circuit diagram of an equivalent circuit of the exemplary sensing dement 10 operating in the second phase in the absence of a touch event. Referring to FIG. 4B, the voltage level at the one end NA of the capacitor CS, by function of virtual short, is Vref2, while at the other end (connected to the output of the amplifier 28) of the capacitor CS is Vout, an output voltage of the amplifier 28. Moreover, the voltage level at both ends NA and NB of the capacitor CP1 is Vref2. Furthermore, capacitor CP2 is coupled between Vref2 and ground potential. As a result, the magnitude of charge, QNA2, can be expressed in equation (6) below.

$$QNA2=[(Vref2-Vout) \times CS]+(Vref2 \times CP2) \quad (6)$$

According to the law of charge conservation, the magnitude of charge acquired in the first phase is equal to that in the second phase in the absence of the touch event. That is, as expressed in equation (7):

$$QNA2=QNA1+QNB1 \quad (7)$$

Based on equation (7), by substituting QNA1, QNB1 and QNA2 in equations (4) to (6), respectively, Vout can be determined in equation (8) below.

$$Vout = (Vref2 - Vref1)\left(\frac{CP2}{CS}\right) + (Vref1 + Vref2 - Vref3) \quad (8)$$

The value of Vout in the absence of a touch event will be compared against its counterpart (Voutf) in the presence of a touch event. The difference between Vout and Voutf is taken as the sensitivity of the fingerprint sensor 1.

Figure 5A:
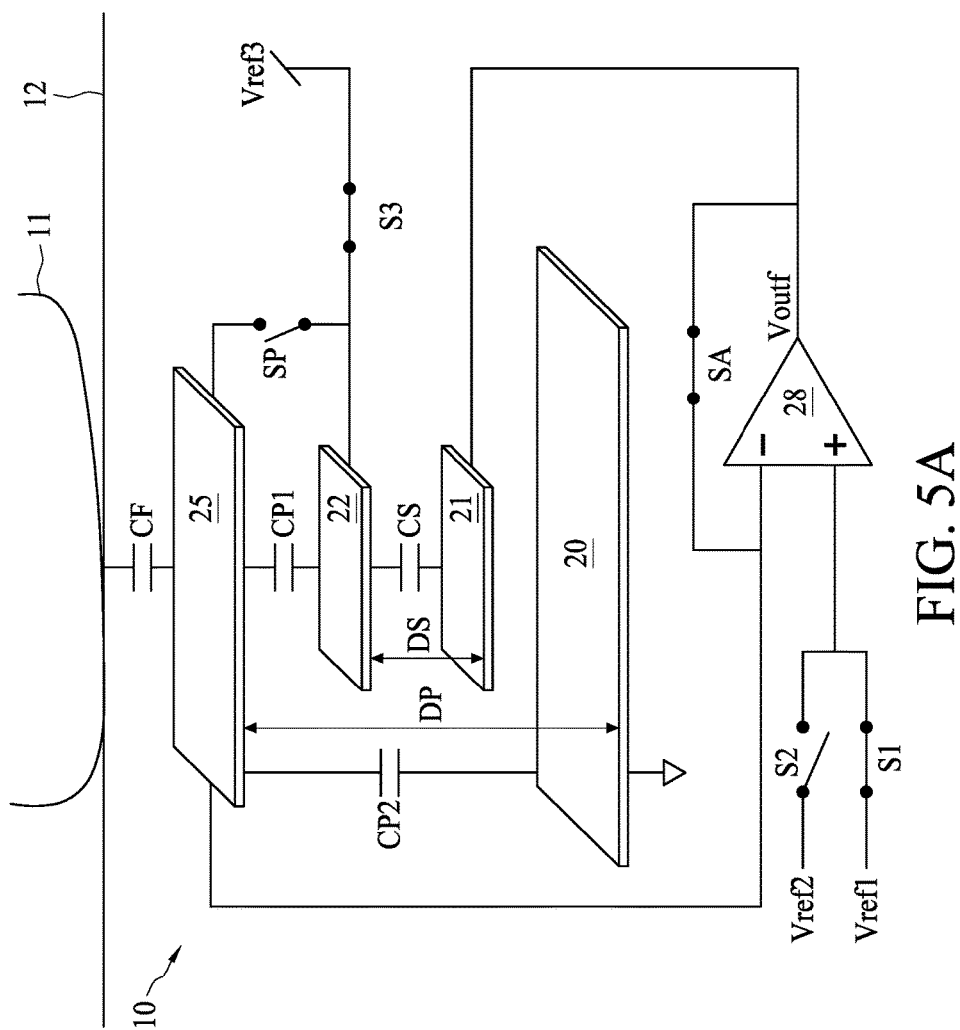
FIG. 5A is a schematic diagram of the exemplary sensing element operating in a first phase in the presence of a touch event, in accordance with some embodiments of the present invention.

FIG. 5A is a schematic diagram of the exemplary sensing element 10 operating in a first phase in the presence of a touch event, in accordance with some embodiments of the present invention. Referring to FIG. 5A, since a touch event is detected, a capacitance CF exists between the object is 11 and the sensing electrode 25. In operation, as previously discussed with reference to FIG. 3A, switches S1, S3 and SA are closed, while switches S2 and SP are open. As a result, the non-inverting terminal of the amplifier 28 receives the first reference voltage Vref1. The inverting terminal of the amplifier 28 is connected to the output of the amplifier 28 and also to the first electrode 21. The second electrode 22 is coupled to the third reference voltage Vref3. Detailed operation will be discussed by reference to FIG. 5B.

Figure 5B:
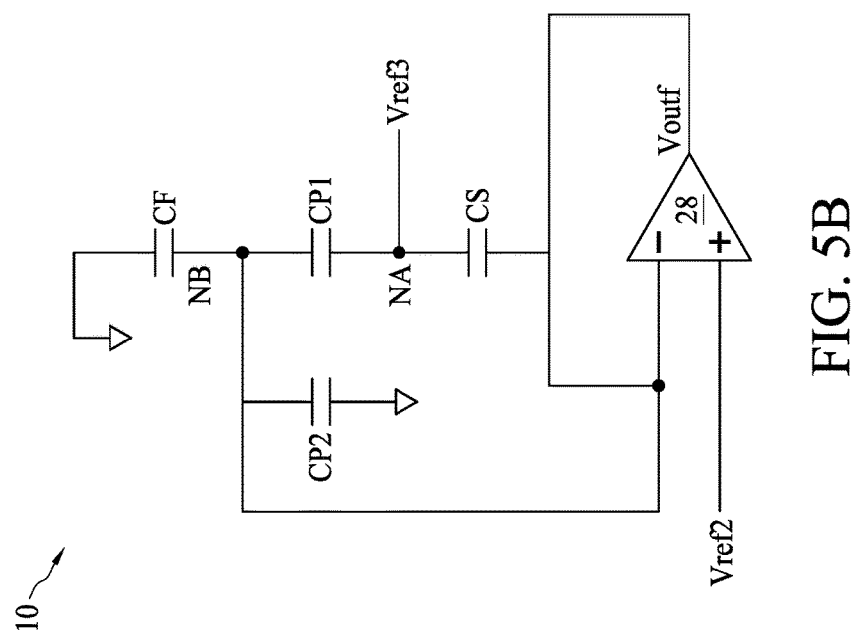
FIG. 5B is a circuit diagram of an equivalent circuit of the exemplary sensing element operating in the first phase in the presence of a touch event.

FIG. 5B is a circuit diagram of an equivalent circuit of the exemplary sensing element 10 operating in the first phase in the presence of a touch event. Referring to FIG. 5B, the equivalent circuit is similar to that described and illustrated with reference to FIG. 3B except that, for example, capacitor CF is connected between node NB and ground. As a result, the magnitude of charge, QNA1f, at the side of node NA can be expressed in equation (9) below.

$$QNA1f=[(Vref3-Vref1) \times CS]+[(Vref3-Vref1) \times CP1] \quad (9)$$

In addition, the magnitude of charge, QNB1f, at the side of node NB can be expressed in equation (10) below.

$$QNB1f=(Vref1-Vref3) \times CP1+[Vref1 \times (CP2+CF)] \quad (10)$$

Figure 6A:
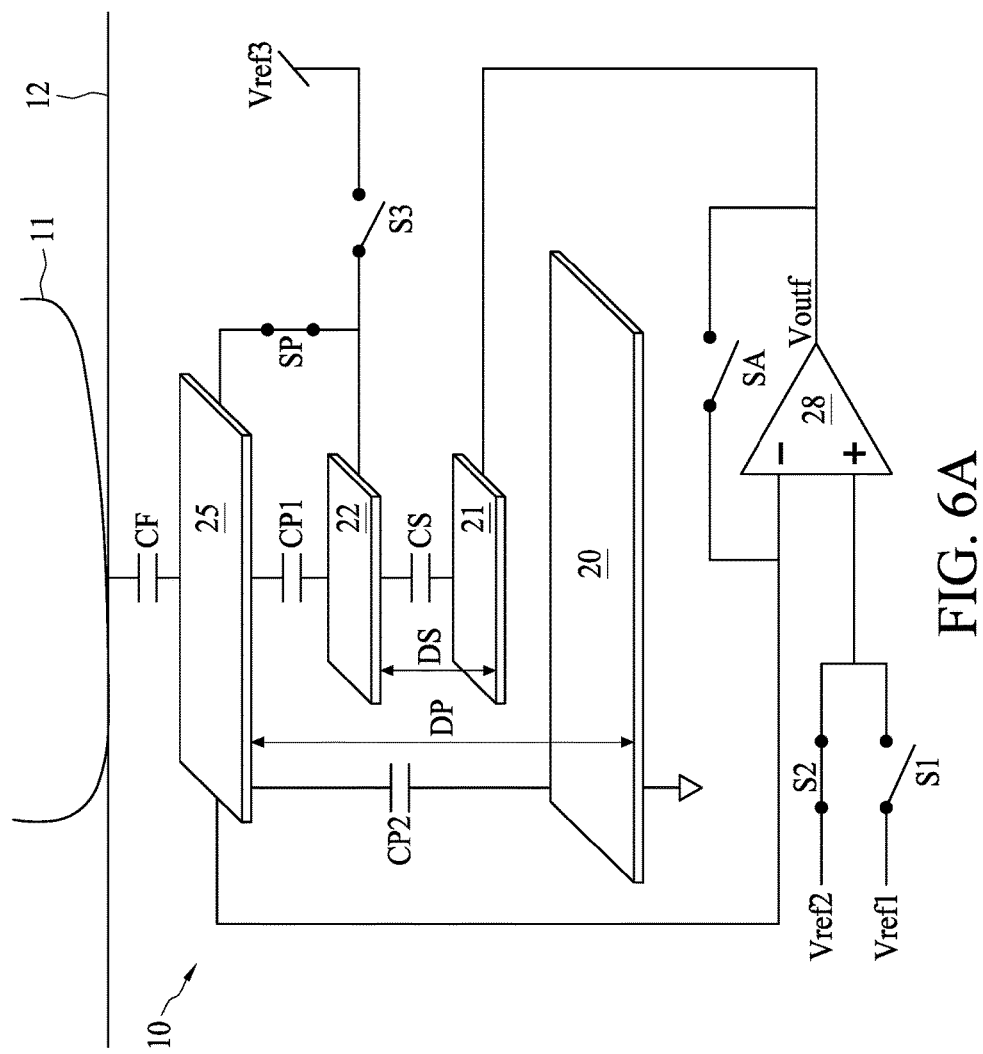
FIG. 6A is a schematic diagram of the exemplary sensing element operating in a second phase in the presence of a touch event, in accordance with some embodiments of the present invention.

FIG. 6A is a schematic diagram of the exemplary sensing element operating in a second phase in the presence of a touch event, in accordance with some embodiments of the present invention. After a reset process in is the first phase as discussed with reference to FIGS. 5A and 5B, a charge sharing process is conducted in the second phase. Referring to FIG. 6A, in operation, switches S2 and SP are closed, while switches S1, S3 and SA are open. As a result, the non-inverting terminal of the amplifier 28 receives the second reference voltage Vref2. The sensing electrode 25 and the second electrode 22 are connected to each other and have the same potential. Consequently, no charge can be stored in the capacitor CP1 between the sensing electrode 25 and the second electrode 22. The charge stored in the capacitor CP1 in the first phase is distributed to other capacitors in the sharing process during the second phase. Detailed operation will be discussed by reference to FIG. 6B.

Figure 6B:
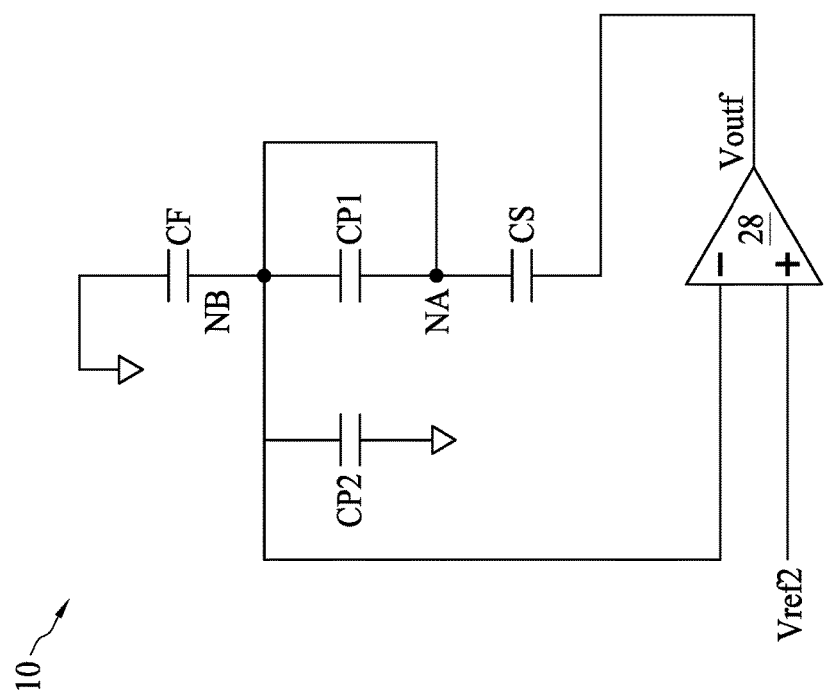
FIG. 6B is a circuit diagram of an equivalent circuit of the exemplary sensing element operating in the second phase in the presence of a touch event.

FIG. 6B is a circuit diagram of an equivalent circuit of the exemplary sensing element operating in the second phase in the presence of a touch event. Referring to FIG. 6B, the equivalent circuit is similar to that described and illustrated with reference to FIG. 3B except that, for example, capacitor CF is connected between node NB and ground. As a result, the magnitude of charge, QNA2f, at the side of node NA can be expressed in equation (11) below.

$$QNA2f=[(\text{Vref2}-\text{Voutf})\times CS]+[\text{Vref2}\times(CP2+CF)] \qquad (11)$$

According to the law of charge conservation, the magnitude of charge acquired in the first phase is equal to that in the second phase in the presence of the touch event. That is, as expressed in equation (12):

$$QNA2f=QNA1f+QNB1f \qquad (12)$$

Based on equations (9) to (11), Voutf can therefore be determined in equation (13) below.

$$Voutf = (Vref2 - Vref1)\left(\frac{CP2 + CF}{CS}\right) + (Vref1 + Vref2 - Vref3) \qquad (13)$$

The difference between Vout and Voutf, denoted ΔVout, is obtained by subtracting Vout from Voutf, as shown in equation (14) as follows.

$$\Delta Vout = Voutf - Vout = (Vref2 - Vref1)\left(\frac{CF}{CS}\right) \qquad (14)$$

In view of equation (14), the sensitivity of the fingerprint sensor 1, represented by ΔVout, is proportional to (Vref2−Vref1) and the ratio of CF to CS. As a result, the sensitivity is independent of the undesired parasitic capacitances CP1 and CP2. Moreover, the sensitivity is inversely proportional to the capacitance CS between the first electrode 21 and the second electrode 22. Accordingly, to enhance the sensitivity of the fingerprint sensor 1, in an embodiment, the distance DS between the first sensing electrode 21 and the second sensing electrode 22 is increased, resulting in a smaller capacitance CS. In another embodiment, the overlapped area between the first electrode 21 and the second electrode 22 is reduced, also resulting in a smaller CS. In still another embodiment, a low-k insulating material is disposed between the first electrode 21 and the second electrode 22 to help lower the dielectric constant and hence lower the capacitance CS. For example, the dielectric constant k is smaller than 3.

In some embodiments, as previously discussed, the first reference voltage Vref1 is ground potential. In that case, the above-mentioned equation (4) that determines the magnitude of charge QNA1 at the side of node NA in the first phase in the absence of a touch event can be simplified to equation (15) below.

$$QNA1=(\text{Vref3}\times CS)+(\text{Vref3}\times CP1) \qquad (15)$$

Likewise, equation (5) that determines the magnitude of charge QNB1 at the side of node NB in the first phase in the absence of a touch event can be simplified to equation (16) below.

$$QNB1=-(\text{Vref3}\times CP1) \qquad (16)$$

Moreover, equation (6) that determines the magnitude of charge QNA at the side of node NA in the second phase in the absence of a touch event can be simplified to equation (17) below.

$$QNA2=[(\text{Vref2}-\text{Vout})\times CS]+(\text{Vref2}\times CP2) \qquad (17)$$

Based on equation (7), by substituting QNA1, QNB1 and QNA2 in equations (15) to (17), respectively, Vout can be determined in equation (18) below.

$$Vout = Vref2\left(\frac{CP2}{CS}\right) + (Vref2 - Vref3) \qquad (18)$$

Equation (18) can also be obtained by simply letting Vref1 in equation (8) equal 0.

Further, in the first phase in the presence of a touch event, equation (9) that determines the magnitude of charge QNA1f at the side of node NA can be simplified to equation (19) below.

$$QNA1f=(\text{Vref3}\times CS)+(\text{Vref3}\times CP1) \qquad (19)$$

Likewise, equation (10) that determines the magnitude of charge QNB1f at the side of node NB in the first phase in the presence of the touch event can be simplified to equation (20) below.

$$QNB1f=-(\text{Vref3}\times CP1) \qquad (20)$$

Moreover, equation (11) that determines the magnitude of charge QNA2f at the side of node NA in the second phase in the presence of the touch event can be simplified to equation (21) below.

$$QNA2f=[(\text{Vref2}-\text{Voutf})\times CS]+[\text{Vref2}\times(CP2+CF)] \qquad (21)$$

Based on equation (12), by substituting QNA1f, QNB1f and QNA2f in equations (19) to (21), respectively, Voutf can be determined in equation (22) below.

$$Voutf = Vref2\left(\frac{CP2 + CF}{CS}\right) + (Vref2 - Vref3) \qquad (22)$$

Equation(22) can also be obtained by simply letting Vref1 in equation (13) equal 0. The difference between Vout in equation (18) and Voutf in equation (22), denoted ΔVout, is obtained by subtracting Vout from Voutf, as shown in equation (23) below.

$$\Delta Vout = Voutf - Vout = Vref2\left(\frac{CF}{CS}\right) \qquad (23)$$

Alternatively, equation (23) can be obtained by simply letting Vref1 in equation (14) equal 0.

In view of equation (23), the sensitivity of the fingerprint sensor 1, represented by ΔVout, is proportional to the second reference voltage Vref2 and the ratio of CF to CS. As a result, the sensitivity is independent of the undesired parasitic capacitances CP1 and CP2. Moreover, the sensitivity is inversely proportional to the capacitance CS between the first electrode 21 and the second electrode 22. To enhance the sensitivity of the fingerprint sensor 1, as previously discussed, the distance DS between the first sensing electrode 21 and the second sensing electrode 22 can be increased, the overlapped area between the first electrode 21 and the second electrode can be reduced, or a low-k insulating material is used as the dielectric between the first electrode 21 and the second electrode 22.

Although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A fingerprint sensor, comprising:
a substrate;
a sensing electrode over the substrate, configured to detect a capacitance in response to a touch event on the fingerprint sensor;
a first electrode between the substrate and the sensing electrode; and
a second electrode between the first electrode and the sensing electrode, the second electrode and the first electrode being configured to define a capacitance therebetween,
wherein sensitivity of the fingerprint sensor is inversely proportional to the capacitance between the first electrode and the second electrode.

2. The fingerprint sensor of claim 1 further comprising an amplifier, the amplifier including:
an inverting terminal coupled to the sensing electrode; and
an output coupled to the first electrode.

3. The fingerprint sensor of claim 2 further comprising a switch between the inverting terminal and the output of the amplifier.

4. The fingerprint sensor of claim 2, wherein the amplifier includes a non-inverting terminal configured to selectively receive one of a first reference voltage and a second reference voltage.

5. The fingerprint sensor of claim 4, wherein the sensitivity of the fingerprint sensor is proportional to the difference between the first reference voltage and the second reference voltage.

6. The fingerprint sensor of claim 5, wherein the sensitivity ($\Delta$Vout) of the fingerprint sensor is given by the following equation:

$$\Delta Vout = (Vref2 - Vref1)\left(\frac{CF}{CS}\right)$$

where Vref2 and Vref1 represent the second reference voltage and the first reference voltage, respectively, CF represents the capacitance in response to the touch event, and CS represents the capacitance between the first electrode and the second electrode.

7. The fingerprint sensor of claim 2 further comprising:
a first switch configured to conduct the first reference voltage to the non-inverting terminal of the amplifier; and
a second switch configured to conduct the second reference voltage to the non-inverting terminal of the amplifier.

8. The fingerprint sensor of claim 2 further comprising a switch configured to conduct a reference voltage to the second electrode.

9. The fingerprint sensor of claim 8 further comprising a switch between the sensing electrode and the second electrode.

10. The fingerprint sensor of claim 1 further comprising a low-k insulating layer between the first electrode and the second electrode.

11. A fingerprint sensor, comprising:
a substrate;
a sensing electrode over the substrate, configured to detect a capacitance in response to a touch event on the fingerprint sensor;
a first electrode between the substrate and the sensing electrode;
a second electrode between the first electrode and the sensing electrode; and
an amplifier including an output connected to the first electrode, a first terminal connected to the sensing electrode, and a second terminal configured to selectively receive one of a first reference voltage and a second reference voltage,
wherein sensitivity of the fingerprint sensor is proportional to the difference between the first reference voltage and the second reference voltage.

12. The fingerprint sensor of claim 11, wherein the first electrode and the second electrode are configured to define a capacitance therebetween, and the sensitivity of the fingerprint sensor is inversely proportional to the capacitance between the first electrode and the second electrode.

13. The fingerprint sensor of claim 12, wherein the sensitivity ($\Delta$Vout) of the fingerprint sensor is given by the following equation:

$$\Delta Vout = (Vref2 - Vref1)\left(\frac{CF}{CS}\right)$$

where Vref2 and Vref1 represent the second reference voltage and the first reference voltage, respectively, CF represents the capacitance in response to the touch event, and CS represents the capacitance between the first electrode and the second electrode.

14. The fingerprint sensor of claim 11 further comprising a switch between the first terminal and the output of the amplifier.

15. The fingerprint sensor of claim 11 further comprising:
a first switch configured to conduct the first reference voltage to the second terminal of the amplifier; and
a second switch configured to conduct the second reference voltage to the second terminal of the amplifier.

16. The fingerprint sensor of claim 11 further comprising a switch configured to conduct a reference voltage to the second electrode.

17. The fingerprint sensor of claim 11 further comprising a switch between the sensing electrode and the second electrode.

18. The fingerprint sensor of claim 11 further comprising a low-k insulating layer between the first electrode and the second electrode.

* * * * *